United States Patent
Yang (10) Patent No.: US 9,196,503 B2
(45) Date of Patent: *Nov. 24, 2015

(54) METHODS FOR FABRICATING DEVICES ON SEMICONDUCTOR SUBSTRATES

(71) Applicant: Michael Xiaoxuan Yang, Palo Alto, CA (US)

(72) Inventor: Michael Xiaoxuan Yang, Palo Alto, CA (US)

( * ) Notice: Subject to any disclaimer, the term of this patent is extended or adjusted under 35 U.S.C. 154(b) by 185 days.

This patent is subject to a terminal disclaimer.

(21) Appl. No.: 13/694,526

(22) Filed: Dec. 10, 2012

(65) Prior Publication Data

US 2014/0057413 A1   Feb. 27, 2014

Related U.S. Application Data

(60) Provisional application No. 61/742,975, filed on Aug. 23, 2012.

(51) Int. Cl.
| | |
|---|---|
| H01L 21/00 | (2006.01) |
| H01L 21/46 | (2006.01) |
| H01L 21/67 | (2006.01) |
| H01L 21/463 | (2006.01) |
| B28D 5/00 | (2006.01) |
| H01L 21/78 | (2006.01) |
| B23K 26/00 | (2014.01) |
| B23K 26/073 | (2006.01) |
| B23K 26/36 | (2014.01) |
| B23K 26/40 | (2014.01) |

(52) U.S. Cl.
CPC ............ *H01L 21/46* (2013.01); *B23K 26/0087* (2013.01); *B23K 26/0736* (2013.01); *B23K 26/367* (2013.01); *B23K 26/4075* (2013.01); *B28D 5/00* (2013.01); *H01L 21/463* (2013.01); *H01L 21/67* (2013.01); *H01L 21/78* (2013.01); *Y10T 29/41* (2015.01)

(58) Field of Classification Search
CPC ...................................................... H01L 21/78
USPC .......................................................... 438/463
See application file for complete search history.

(56) References Cited

U.S. PATENT DOCUMENTS

| | | | | |
|---|---|---|---|---|
| 3,773,321 | A * | 11/1973 | Burroughs ............. | B65H 7/125 192/128 |
| 4,261,781 | A * | 4/1981 | Edmonds ............... | B28D 1/005 148/DIG. 28 |
| 4,736,942 | A * | 4/1988 | Wiley .................... | A41H 43/02 271/195 |
| 5,489,555 | A * | 2/1996 | Yamazaki ............. | H01L 31/068 136/243 |
| 7,775,520 | B2 * | 8/2010 | Matsudaira .......... | B65H 29/241 271/265.04 |
| 2009/0246936 | A1 * | 10/2009 | Yamazaki ......... | H01L 21/76254 438/458 |
| 2010/0273310 | A1 * | 10/2010 | Hanaoka ........... | H01L 21/76254 438/458 |
| 2010/0275995 | A1 * | 11/2010 | Kaes ............... | H01L 31/022425 136/258 |
| 2010/0304522 | A1 * | 12/2010 | Rana ................. | H01L 21/26586 438/71 |
| 2011/0005582 | A1 * | 1/2011 | Szlufcik ............ | H01L 31/02245 136/252 |
| 2011/0108916 | A1 * | 5/2011 | Calabrese ......... | H01L 21/26506 257/343 |
| 2013/0032946 | A1 * | 2/2013 | West ...................... | H01L 21/78 257/774 |
| 2013/0061917 | A1 * | 3/2013 | Huang ............ | H01L 31/022425 136/256 |
| 2013/0062020 | A1 * | 3/2013 | Ries ................. | H01L 21/67092 156/715 |
| 2013/0130425 | A1 * | 5/2013 | Medina .............. | B23D 57/0023 438/68 |
| 2013/0139884 | A1 * | 6/2013 | Lee ........................ | H01L 31/068 136/258 |
| 2013/0341858 | A1 * | 12/2013 | Herrmann ............. | B41J 13/009 271/225 |

* cited by examiner

*Primary Examiner* — Shaun Campbell
*Assistant Examiner* — Ismail Muse (57) ABSTRACT

The present invention relates to insertion of a substrate separation step in fabrication of electronics, optoelectronics and microelectromechanical devices (MEMS), particularly double-sided devices which functionalities require designs and fabrication processes at both sides of substrates. In the method, both sides of a semiconductor substrate are processed, prior to slicing of the substrate from the sidewall into two pieces, and the device fabrication continues on the new surfaces of the two resulting substrates after the slicing. The present invention is applicable to various schemes in crystalline silicon solar cell fabrication. Compared with the baseline manufacturing flow, the method can produce two solar cells from one starting substrate, with a potentially significant reduction in production cost per final solar cell.

18 Claims, 10 Drawing Sheets

FIGURE 1 (PRIOR ART)

1. Incoming wafer
2. Saw damage removal and surface texturing
3. POCl$_3$ diffusion
4. PSG removal
5. Edge isolation
6. SiNx:H deposition
7. Front side metalization by screen printing
9. Backside metalization, co-firing

METHODS FOR FABRICATING DEVICES ON SEMICONDUCTOR SUBSTRATES

CROSS REFERENCE TO RELATED APPLICATION

The present invention claims priority to U.S. Provisional Application No. 61/742,975 filed Aug. 23, 2012.

FIELD OF THE INVENTION

The present invention is directed to fabrication of electronics, optoelectronics, and microelectromechanical systems (MEMS) devices. The method also relates to crystalline silicon solar cell fabrication, preparation of thin semiconductor substrates, and materials processing by laser irradiations.

BACKGROUND OF THE INVENTION

The present invention is directed to fabrication of electronics, optoelectronics, and microelectromechanical systems (MEMS) devices. The method is particularly applicable to fabrication of double-sided devices, i.e. the devices which functionalities require designs and manufacturing processes on both front and back sides of the substrates.

A good example of double-sided devices is crystalline silicon solar cells. In a crystalline silicon solar cell, different materials and structures are fabricated at front and back sides of a silicon substrate. Upon a solar illumination on the cell, positive/negative charges are generated in the silicon substrate and electrical currents are carried out by metal contacts fabricated on the surfaces.

The category of double-sided devices also include several types of semiconductor power devices, including power metal oxide semiconductor field-effect transistor (MOSFET) and insulated-gate bipolar transistor (IGBT). Power MOSFET is the most widely used low-voltage (<200 V) switch. It can be found in power supplies, DC to DC converters and low voltage motor controllers. IGBT combines the simple gate-drive characteristics of MOSFETs with the high-current and low-saturation-voltage capability of bipolar transistors in a single device. It is used in medium- to high-power applications ranging from power inverters in renewable energy industries to electric vehicles/trains and energy efficient appliances. Both power MOSFET and IGBT are three-terminal semiconductor devices. An isolated gate FET structure and two terminals are fabricated on one side of the silicon wafer, with the third terminal at the other side of the substrate.

Some microelectromechanical systems (MEMS) devices are also both sided. Sensors/actuators and other structures are often constructed with patterning and processing on both sides of a silicon wafer, and can be integrated with microprocessors fabricated on the same substrate.

Figure 1:
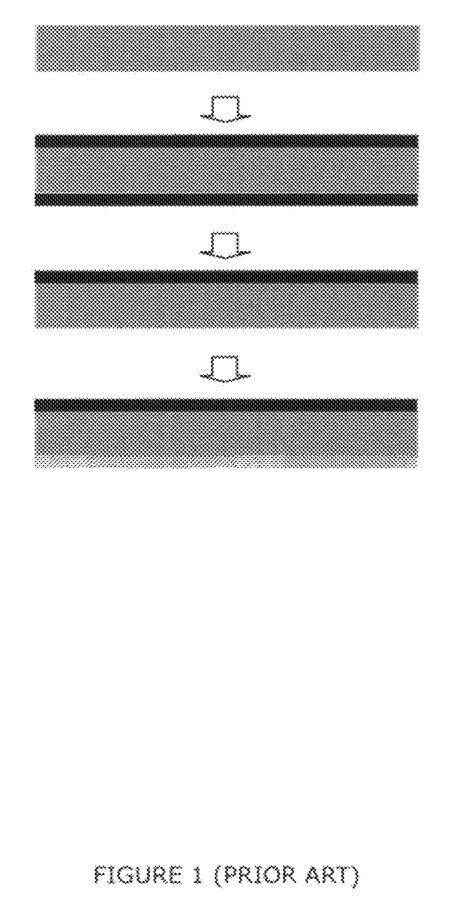
FIG. 1 illustrates a generic sequence in fabrication of double-sided electronics, optoelectronics and microelectromechanical systems (MEMS) devices.

The manufacturing process of double-sided devices can be more complicated than that of single-sided devices, which have designs on only one side of the substrates. Some of the challenges in double-sided device fabrication are associated with a cross contamination between two sides of the substrates from double-sided manufacturing processes. Many manufacturing processes are double-sided in nature, i.e. the processes that proceed on both sides of the substrates at the same time. Such double-sided process step(s) can include but not limited to cleaning, film deposition, diffusion, etch, ion implantation, and patterning. However, double-sided devices generally require different designs and process steps on the front and back sides of the substrates. As a result, some double-sided manufacturing processes can be desirable or necessary for one side of substrate in double-sided devices, but may not be desirable or must be avoided on the other side of the substrate. FIG. 1 illustrates a generic manufacturing flow of double-sided devices. Manufacturing processes required for one side of the substrate are first carried out. Some of the manufacturing processes are double-sided and contaminate the other side of the substrate. As a result, the other side of the substrate needs to be cleaned or polished prior to the subsequent manufacturing processes on the other side of the substrate.

Figure 2:
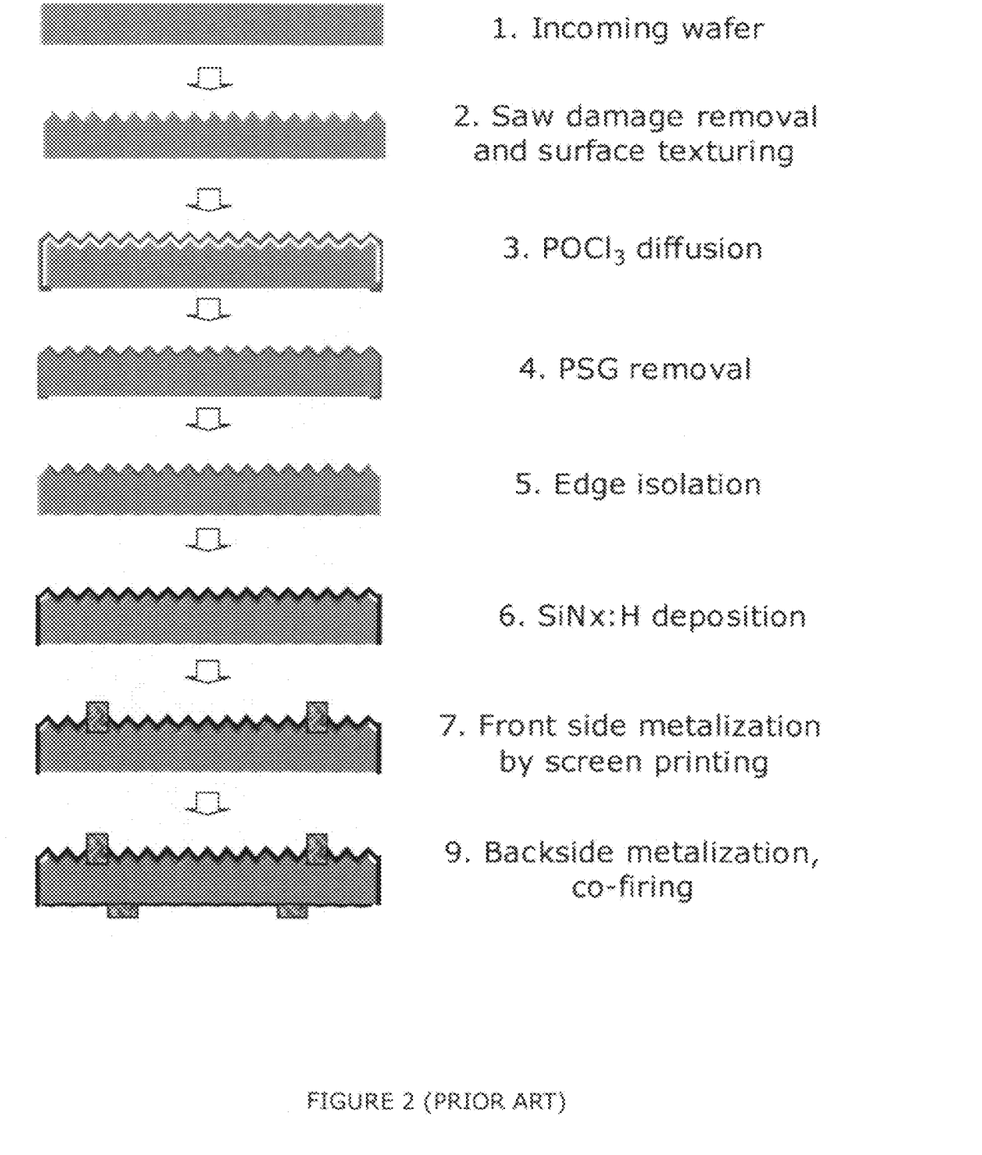
FIG. 2 illustrates a baseline manufacturing flow in crystalline silicon solar cell manufacturing.

Such cleaning/polishing processes can be tedious and costly. Under some circumstances (e.g. crystalline silicon solar cell fabrications), the cleaning/polishing processes are avoided in alternative manufacturing flows, albeit with compromises in device performances. FIG. 2 illustrates a baseline manufacturing flow of crystalline silicon solar cells. A silicon substrate 1 first passes through wet etch steps to remove contamination and damaged silicon on the surface and to undergo surface texturing 2. The next manufacturing process is emitter formation. With a regular boron doped (p-type) silicon substrate, an n-type emitter region is formed, typically by a high temperature (800-900 C) phosphorus oxychloride ($POCl_3$) diffusion process 3 carried out in a furnace. A phosphosilicate glass (PSG) layer is also formed during the $POCl_3$ diffusion process. It is removed in a subsequent HF-based wet etch 4. The next step in the process flow is an edge isolation step 5 to remove phosphorus dopant from the edges of the substrates. The wafer front surface is then coated by an anti-reflective (AR) layer, e.g. a hydrogenated silicon nitride ($SiN_x$:H) layer 6. Finally, in steps 7 and 9, front-side metal contacts (Ag) and back-side metals (Al/Ag) are fabricated by screen printing and then solidified through a final co-firing process.

A number of manufacturing steps shown in FIG. 2 are double-sided, including surface cleaning and texturing step 2, phosphorus diffusion step 3 and associated PSG removal step 4. In addition, silicon nitride deposition step 6 can be carried out either single-sided or double-sided, although a single-sided silicon nitride deposition is generally preferred with no back-side silicon nitride layer in the generic solar cell structure. The manufacturing flow of crystalline silicon solar cells needs to accommodate the double-sided process steps, especially the phosphorous furnace diffusion process. The aluminum (p-type) field deposition in backside metalization 9 compensates phosphorous (n-type) dopant on the wafer backside, and the edge isolation step 5 is critical to a functional solar cell by preventing shorts between n-type emitter at front and p-type collector at back of the substrates in the final structure.

The present invention also relates to preparation of thin semiconductor substrates. Substrates for use in the field of electronics, optoelectronics, and microelectromechanical systems (MEMS) devices are generally obtained by slicing/cutting/separating ingots. In the case of mono-crystalline silicon, for example, the ingots are obtained from a bath of molten silicon using the Czochralski (Cz) or the float zone (Fz) methods. These conventional methods produce cylindrical ingots which are cut by a circular or wire saw into slices perpendicular to the axis of the cylindrical ingot. The cut of the cylindrical ingots results in round wafers which are common for fabrication of general electronics and MEMS devices. In crystalline silicon solar cell production, silicon blocks are first prepared from the cylindrical ingots, before being cut into square or substantially square wafers.

Microprocessor and memory devices can function properly with less than one micron of silicon thickness. However, current silicon substrates in mass production are significantly thicker. 150 mm diameter silicon wafers have a standard thickness of ~675 microns, 200 mm diameter silicon wafers have a standard thickness of ~725 microns, and 300 mm diameter wafers have a standard thickness of ~775 microns. A silicon-on-insulator (SOI) process has been developed to laminate a sub-micron pristine silicon layer on top of another insulating substrate (such as a silicon wafer with an insulating silicon oxide top layer). An improvement of transistor switching speed and a reduction in transistor power consumption have been reported for integrated circuits fabricated on the SOI substrate.

In production of general electronic devices with integrated circuits, multiple devices are first fabricated on a single wafer, and the devices at this stage are known as dies on the wafers. After completion of the manufacturing flow, wafers are cut along x- and y-directions to isolate individual dies, before each functional die is packaged with proper encapsulation and input/output (I/O) connectors. Often the wafers are thinned down from the back side before the wafer dicing step. The reduced substrate thickness can help to yield a lower profile in the final package. Thin dies can also be stacked up for additional functionalities or a more compact final packaging size, desirable in consumer electronics applications.

Wafer thinning is also adopted in fabrication of MEMS devices. MEMS devices such as micro-sensors and micro-actuators are usually manufactured on silicon wafers with process steps similar to fabrication of general electronic devices, with addition of mechanical components in dimensions of 1-100 microns. Silicon substrates of a thickness less than 100 microns are also flexible, suitable for some ultra light-weight, portable applications, e.g. new gadgets in curved or flexible forms.

With a solar cell structure design consisting of a surface texturing, an anti-reflective coating (ARC) layer deposition on the front surface and a reflector layer deposition at the back surface, solar cells of 18-24% efficiency are currently manufactured on mono-crystalline silicon substrates of >150 microns thickness. With some advanced light trapping technologies, it is conceivable to maintain the high solar cell efficiency with a silicon substrate of 100 microns or less in thickness.

In crystalline silicon solar cell production, ~180 micron thick substrates (156 mm×156 mm or 125 mm×125 mm square) are common today, while ~150 micron substrate thickness are becoming available with the advanced wire-saw systems to cut silicon ingots/blocks.

Silicon substrate cost often accounts for >50-60% of total manufacturing cost of mono-crystalline silicon solar cells. Thus there is a significant economical incentive to reduce silicon substrate thickness without reducing cell efficiency and without increasing manufacturing complexity/cost. However, current silicon substrate preparation technologies have their limitations. A cutting of hard materials such as silicon by wire saws is associated with considerable consumable cost (cutting wires and slurries) and a significant kerf loss, i.e. the amount of silicon removed by cutting wires. Despite of the continuous improvements in wiresaw equipment, process and materials, it remains challenging to produce wafers of less than 100 microns thickness with a kerf loss of less than 100 microns.

Alternative thin substrate technologies have been proposed for crystalline silicon solar cell production. In one method, ultrathin silicon wafers of less than 20 microns are produced by implantation of high energy hydrogen ions into silicon substrates, followed by a thermal or mechanical exfoliation. The idea is analogous to the commercial silicon-on-insulator (SOI) substrate technologies in advanced IC manufacturing.

In another method, deposition of a thin metal (e.g. nickel) layer on the silicon substrate surface is followed by a low temperature anneal to form a thin metal silicide interface layer. A thin silicon wafer can then be exfoliated from the substrate by a mechanical wedge. Both silicon exfoliation methods can be repeated to produce multiple ultrathin silicon wafers (10-50 microns) from a single substrate with a negligible kerf loss.

Even though the silicon materials consumption can be lowered by the silicon exfoliation technologies, hurdles exist for their adoption in mass production of solar cells. A reliable handling of ultrathin substrates of <50 micron thickness can be difficult. Different from wiresaw cutting of a silicon ingot which can produce multiple wafers in parallel, silicon wafers can only be the substrate surface may also be necessary. As a result, manufacturing cost rises along with an increase of work-in-progress (WIP) inventory and cycle time. An adoption of the ultrathin silicon substrates can also require some significant exfoliated from a silicon substrate one at a time. A periodic reconditioning of modifications in solar cell manufacturing processes. An ultrathin substrate requires a more sufficient light trapping to maintain a high solar cell efficiency, yet a proper surface texturing for efficient light trapping is difficult on a Si(111) surface, the preferred surface orientation for the silicon wafer exfoliation technologies. In addition, alternative metalization technologies may need to be developed to accommodate the fragile ultrathin silicon substrates.

The methods used for substrate fabrication in the present invention can involve a laser irradiation process. Different lasers have different active media for coherent light generation. The most common active media include gases (in gas lasers), rare-earth element doped crystals (in solid state lasers), and semiconductor materials (in semiconductor lasers). Other laser types include chemical lasers, dye lasers, metal vapor lasers, etc.

In a gas laser, an electrical circuit is discharged through a gas to produce a coherent light. For example, $CO_2$ lasers can emit hundreds of kilowatts at 10.6 microns, and are often used in industrial applications such as cutting and welding. Excimer lasers are a subgroup of gas lasers which are powered by a chemical reaction involving an excited dimer, or excimer. Common ultraviolet (UV) excimer lasers include $F_2$ laser (emitting at 157 nm), ArF laser (193 nm), KrCl laser (222 nm), KrF laser (248 nm), XeCl laser (308 nm), and XeF laser (351 nm).

In solid state lasers, a crystalline or glass rod is "doped" with ions for the required energy states in coherent light generation. Yttrium aluminum garnet (Nd:YAG), yttrium lithium fluoride (Nd:YLF) and yttrium orthovanadate (Nd:$YVO_4$) lasers can produce powerful pulses at 1064 nm. The laser intensity can be amplified through an optical fiber. The so called fiber lasers can deliver multi-kilowatt laser powers with an excellent electricity to laser power conversion efficiency, and have increasing industrial applications in cutting, welding and marking of metals and other materials. Common Diode Pumped Solid State (DPSS) lasers wavelength is 1064 nm, frequency-doubled 532 nm (green), frequency-tripled 355 nm (UV) and frequency-quadrupled 266 nm (UV).

Semiconductor lasers are commonly known as laser diodes. The active medium in laser diodes is a semiconductor material with a p-n junction. The emitting wavelength of laser iodides can range from ~0.4 to 20 microns, with applications in telecommunications, holography, printing, and machining/welding. Laser iodides can also serve as pump sources for other lasers.

There are a number of laser applications in electronic device fabrications. The first group of applications is laser patterning/scribing. Laser patterning processes have been adopted in IC packaging and solar cell production, via a direct materials ablation process. A similar materials ablation process can also be used for laser dicing of wafers into individual dies. An alternative method for laser dicing involves focusing a high intensity laser beam inside the substrates. In the so-called Stealth Dicing process, the substrate materials is transparent to the laser irradiation of the basic frequency, but can be modified by a multi-photon absorption process at the laser converging point inside the substrate. After completion of the laser scan along the scribe lines, wafers are bonded to a supporting tape. When the supporting tape is stretched, dies can be separated with a near-zero kerf loss.

Some other laser-based processes involve a melt or sub-melt of substrate materials. Applications include dopant activation on silicon wafers in advanced transistor fabrications, and amorphous silicon film crystallization on glass substrates as backplanes for high-resolution flat panel displays. With a careful materials design and laser wavelength/power selection, a laser irradiation can also selectively melt a bonding layer and detach thin films/materials from the substrates. Applications include laser liftoff of LED dies from substrates (sapphire, silicon, etc.), and release of flexible displays from temporary carriers.

The present invention is also related to substrate handling in production of electronics devices. Substrates such as semiconductor wafers or large sheets of glass can be held in compliance to substrate chucks by an electrostatic force or a pressure delta between two sides of the substrates. Some substrate chucks are in a direct physical contact with the substrates. In other chuck designs, substrate chucks are in a close proximity to but not in a direct physical contact with the substrates. The non-contact substrate chucks often adopt a fluid-mechanical design and operate like a return spring. The working distance (between the substrates and the chuck) and stiffness of the chuck "spring" can be optimized. Substrates can also be transported across the surface of stationary non-contact chucks. In flat panel display panel production, non-contact fluid-mechanical chucks have been used for automation of glass substrates in coating, patterning, and optical inspection/metrology processes. In thin film solar production, non-contact fluid-mechanical chucks have been adopted in automation of substrates for laser scribing, etc.

SUMMARY OF THE INVENTION

The present invention relates to application of a substrate slicing process in fabrications of electronics, optoelectronics and microelectromechanical systems (MEMS) devices, particularly double-sided devices. The method proposed in the present invention is applicable to various crystalline silicon solar cell manufacturing schemes. In some embodiments, the substrate slicing step is carried out after specific processes in solar cell production, including cleaning/texturing, doping by diffusion or implantation, film deposition, patterning and metalization.

This invention is further directed to methods of slicing a semiconductor wafer into two pieces from substrate sidewall. In one embodiment, the method involves a laser cutting from the wafer sidewall. In another embodiment, the method includes forming a damage layer inside the wafer by a laser irradiation on the wafer surface, prior to slicing or separating the wafer at the damaged layer position. In yet another embodiment, the slicing from substrate sidewall comprises a mechanical cleaving step.

BRIEF DESCRIPTIONS OF THE DRAWINGS

Embodiments are illustrated in the following detailed description and are not limited in the following figures.

DETAILED DESCRIPTION OF THE PREFERRED EMBODIMENTS

The following description in combination with the figures is provided to assist in understanding the teachings disclosed herein. The description focuses on specific implementations, embodiments and advantages of the teachings, and should not be interpreted as a limitation on the scope or applicability of the teachings.

Embodiments of the present invention are directed to methods of fabrication of electronics, optoelectronics and microelectromechanical systems (MEMS) devices, with insertion of a substrate separation process in which a thin substrate (i.e. a semiconductor wafer) is sliced into two substrates, and the two resulting substrates possessing in general the same front/back surface area as the starting substrate. A manufacturing flow consisting of a wafer slicing step can yield two final product wafers from a single starting wafer, thus halve the consumption and cost of substrate materials in each final device.

Figure 3:
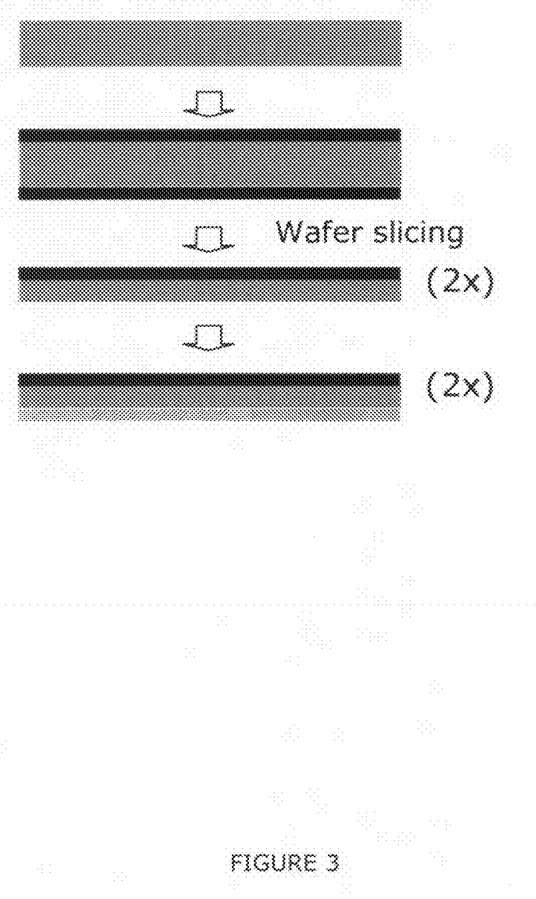
FIG. 3 illustrates the manufacturing sequence of double-sided electronics, optoelectronics and microelectromechanical systems (MEMS) devices according to the present invention.

In an embodiment of the invention, a substrate slicing step is inserted in the manufacturing flow of electronics, optoelectronics and microelectromechanical systems (MEMS) devices after at least one double-sided process step(s) on the starting substrate. The proposed method of double-sided device fabrication comprising a substrate slicing step is illustrated in FIG. 3, in comparison with the generic method shown in FIG. 1. The proposed manufacturing flow in the present invention doubles output device units with the same production volume and cost of the double-sided processes prior to the wafer slicing step. As a result, production cost of each final device can be reduced by half for such double-sided processes prior to the substrate slicing step.

As shown in FIG. 3, the manufacturing process of electronic devices can continue and complete on the two resulting wafers after the slicing step. Each of the two resulting substrates after the slicing step has one surface from the starting substrate prior to the slicing, and another surface generated fresh from the slicing process. For simplicity of the following discussions, the surface from the starting substrate prior to the slicing is assigned as the front side of the resulting substrates, and new surface generated from the slicing process is defined as the back side of the resulting substrates. In one embodiment of the present invention, at least one process step(s) is carried out on the new (back) surface of the two resulting wafers after the slicing. Such process step(s) can also include but not limited to cleaning, etching, diffusion, ion implantation, film deposition and patterning. This embodiment is applicable to fabrication of double-sided devices.

Compared with the generic manufacturing flow of double-sided devices shown in FIG. 1, the proposed method in the present invention comprising a substrate slicing step can reduce the manufacturing complexity of the double-sided electronic devices. As described in Background Section, double-sided electronic devices generally require different designs and process steps on the front and back sides of the substrates. Some double-sided manufacturing processes, however, can be desirable or necessary only for one side of substrate, but may be not desirable or must be avoided on the other side of the substrate. With insertion of a substrate slicing step in the manufacturing flow of double-sided devices shown in FIG. 3, the two resulting wafers after the slicing can have a fresh (back) surface, and ready to proceed with following manufacturing processes. In addition, double-sided processes prior to the slicing can be optimized solely with the design consideration on the front surface. Overall results are a simpler manufacturing process flow, a opportunity for significant production cost reduction, and a potential improvement in device performance.

Figure 4:
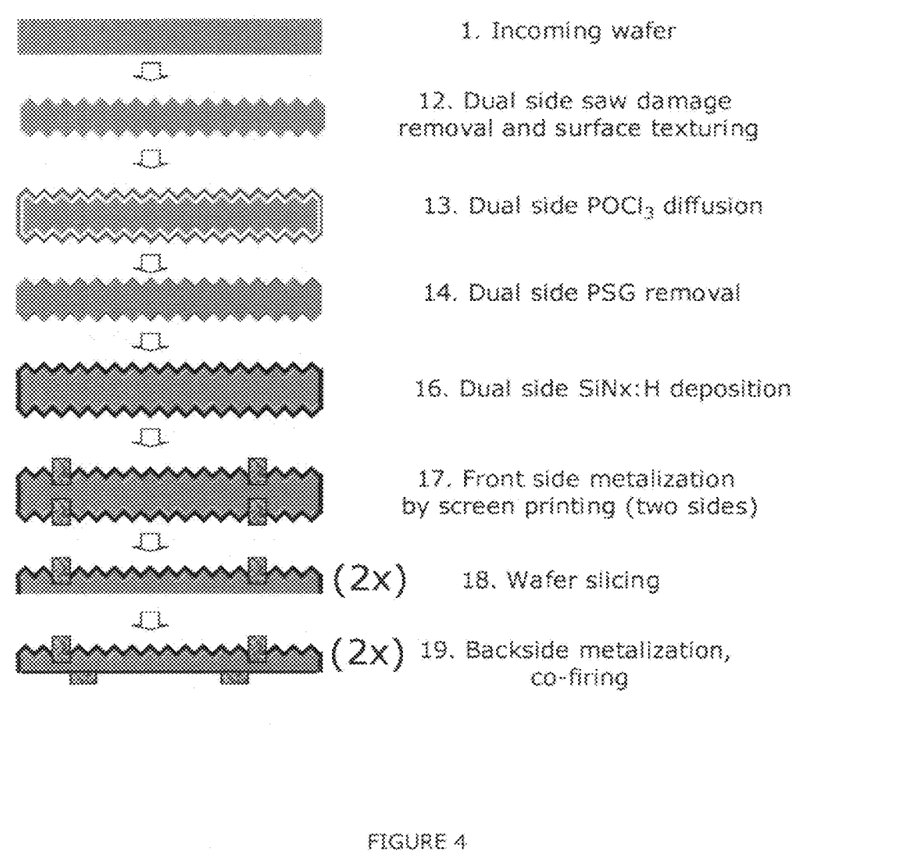
FIG. 4 illustrates a process flow for manufacturing a crystalline silicon solar cell according to the present invention.

The proposed method is applicable to crystalline silicon solar cell fabrication. FIG. 4 illustrates a crystalline silicon solar cell production flow comprising a substrate slicing step on a regular boron-doped (p-type) substrate. The proposed scheme is provided to assist in describing the teachings and should not be interpreted as a limitation of the methods.

In comparison to the generic process illustrated in FIG. 2 with the same starting substrate thickness, the method shown in FIG. 4 comprising a substrate slicing step can halve the substrate consumption and cost in each final solar cell. It can be advantageous with the solar cell substrate thickness approaches the limits for wiresaw cutting of silicon ingot yet silicon substrate cost still accounts for approximately half or more in the total solar cell production cost. With a nominal starting wafer thickness of 150-200 microns, the manufacturing flow comprising a substrate slicing step can produce solar cells of 50-100 microns in final thickness. A high cell efficiency can be maintained with standard light trapping technologies including surface texturing, anti-reflective (AR) film coating and backside metal deposition.

The first few manufacturing steps in the proposed method illustrated in FIG. 4 are similar to the baseline solar cell manufacturing flow shown in FIG. 2, including wet clean for surface damage/contamination removal, wet etch for surface texturing 12, furnace diffusion of phosphorus dopant 13 and wet etch for phosphosilicate glass (PSG) removal 14. The wet clean/etch and the furnace diffusion steps are all double-sided processes, i.e. can simultaneously proceed on both sides on the substrates. By loading substrates with a uniform spacing in wet benches and furnaces for the double-sided processes, front and back sides of the wafers can undergo identical processes. Insertion of a substrate slicing step after the double-sided process steps can further reduce the solar cell production cost for each final solar cell, by doubling number of the solar cells produced with the same production volume and cost of the double-sided steps prior to the substrate slicing.

One process step in baseline solar cell manufacturing process shown in FIG. 2 is edge isolation 5. The edge isolation step reduces effective solar cell wafer area and thus overall solar cell efficiency. The cell efficiency loss is estimated to be 0.2-0.3% per unit area, a considerable amount versus a baseline cell efficiency of 16-18%. Such edge isolation step can be eliminated from the proposed manufacturing flow shown in FIG. 4 comprising a substrate slicing step. With a substrate slicing after the double-sided phosphorus furnace diffusion and PSG removal processes, the two resulting wafers after the slicing have phosphorus dopant only on the front side, with no short to the backside collector/metal in the final solar cell structure. The elimination of edge isolation step can further reduce solar cell production cost, with an opportunity to improve solar cell efficiency at the same time.

With the elimination of edge isolation process in the manufacturing flow shown in FIG. 4, the PSG removal step 14 is directly followed by the SiNx:H antireflective (AR) film deposition step 16. SiNx:H deposition can be carried out in either inline equipments or furnaces. A double-sided SiNx deposition (such as thermal deposition in furnaces) can be cost competitive vs current single-sided deposition tools. In the present invention, a double-sided SiNx:H deposition can be adopted before the substrate slicing step. The process sequence can further reduce SiNx:H deposition cost for each final solar cell.

Front-side metalization is the next step 17 after SiNx:H deposition in solar cell fabrication. Current screen printing equipments generally print on single side of wafers. By repeating the same front-side metalization process on the other side of the starting wafer (step 17) before the substrate slicing step 18, both resulting wafers after the slicing can have all front-side processes completed.

In the method proposed in the present invention, it can be advantageous to complete screen printing of front-side metal contacts on both sides of the starting wafers (step 17) prior to the substrate slicing step 18. In a screen printing process, metal paste is squeegeed over the wafer surface with a defined pressure. Wafer breakage is an ongoing issue for screen printing of narrow metal lines on the front-side of solar cells. The wafer breakage rate increases with a decrease in wafer thickness, and it is difficult to process wafers of <100 micron thickness in present screen printing tools for front-side metalization. As a result, delaying screen printing of front-side metals after substrate slicing step 18 may result in a lower production yield, due to a higher wafer breakage rate in front-side metalization screen printing tool with a reduced substrate thickness.

The wafer breakage in screen printing tools can be attributed to intrinsic defects in the incoming substrates. Consequently, wafers successfully passing the screen printing tool once have a good chance to go through it again. Assuming a negligible wafer breakage rate in the second pass, the effective wafer breakage rate in the front-side metalization screen printing equipments can be reduced by ~50% with the proposed double-pass/double-side front-side metalization scheme. In addition, it is conceivable to start with slightly thicker substrates in a solar cell fabrication scheme comprising a substrate slicing step after front-side metalization, yet still finish with solar cells with significantly lower substrate thickness/cost than the conventional method without substrate slicing. It can further reduce wafer breakage rate in front-side metalization process.

In FIG. 4, both resulting wafers after the substrate slicing step 18 have front-side processes completed, with the substrate back side fresh and ready for back-side metalization step 19. Since phosphorus doping is absent on the back side of the resulting wafers after slicing, back-side aluminum field deposition can be optimized and consistent from wafer to wafer, independent to any modification/variation in the front-side phosphorus diffusion step 13.

In conclusion, it is desirable to incorporate a substrate slicing step 18 in a crystalline silicon solar cell manufacturing flow as illustrated in FIG. 4. Compared with the baseline method shown in FIG. 2, solar cell production cost can be significantly reduced with a ~50% reduction in substrate thickness/cost, an elimination of edge isolation step 5, and a 50% cost reduction per final device for all double-sided processes prior to the substrate slicing (cleaning/texturing 12, phosphorus diffusion 13, PSG removal 14 and SiNx deposition 16). A resulting solar cell thickness of 50-100 microns can be suitable for optimization of cell efficiency. The solar cell efficiency can be further improved with the elimination of edge isolation step 5. Finally, not only the existing solar cell manufacturing lines and processes can be adopted without any issues, wafer breakage rate can be also reduced in front-side metalization screen printing step 17, even with a 50% reduction in final solar cell thickness.

The discussions above describe benefits of solar cell production with insertion of a substrate slicing step in the baseline solar cell manufacturing process with a boron-doped (p-type) substrate. The present invention can also be applicable to various advanced solar cell technologies.

Magnetic Czochralski (M-Cz) materials are considered of better quality than basic Czochralski (Cz) boron doped (p-type) silicon substrate in solar cell production. Comparing with the Cz materials, M-Cz silicon materials have a lower oxygen impurity level, resulting in a longer minority carrier lifetime, especially after a solar irradiation. For a similar improvement in minority carrier lifetime stability after illumination, p-type (boron as dopant) silicon substrates can also be replaced by n-type (either phosphorus or gallium as dopant) substrates. The higher quality substrate materials can yield a higher solar cell efficiency. On the other hand, M-Cz materials and n-type substrates are more expensive than conventional p-type Cz materials. A substrate slicing step can reduce substrate materials consumption/cost, thus can be advantageous if such higher cost/higher performance substrate materials are used in solar cell fabrication.

Solar cell fabrication on n-type silicon substrates also requires a boron diffusion step for emitter formation on the cell front surface, analogous to the phosphorus diffusion step in solar cell fabrication on the p-type substrates discussed above. In an embodiment of the invention, a solar cell manufacturing flow comprises a double-sided boron diffusion process prior to the substrate slicing.

Fabrication flow of advanced solar cells can consist of some new manufacturing processes. Furnace diffusion (step 3 in FIG. 2) can be replaced by an ion implantation process. A patterned implant step can also yield a selective emitter structure, with an improvement in metal contact and front-side light adsorption. In an alternative approach, a selective emitter structure can be fabricated by a laser patterning process with a nickel electroless/copper electrolytic plating metalization. In several embodiments of the present invention, solar cell manufacturing flows can comprise ion implant, or laser patterning, or electroplating processes prior to a substrate slicing step.

The embodiments of laser patterning or metal plating prior to substrate slicing are also applicable to fabrication of so called Interdigitated Back Contact (IBC) cells, which have the highest cell efficiency demonstrated in mass production as of today. An n-type (phosphorus Cz) silicon substrate with a minority carrier lifetime in a range of tens of milliseconds is required for the best IBC cell efficiency. In a typical IBC cell structure, a top surface field is established with a light phosphorus doped layer (e.g. via POCl$_3$ diffusion), followed by a surface passivation/anti-reflective (AR) coating layer (e.g. a SiNx:H film or a SiNx:H/SiO$_2$ film stack). All the metal contacts in IBC cells are located on the back side of the substrate, away from solar illumination. Closely packed contacts on cell back-side can be prepared in a number of process steps, including deposition of a passivation layer (e.g. SiO$_2$), laser patterning, electroplating n+ and screen plating p+ contacts. In the present invention, it is conceivable to have an IBC cell manufacturing flow comprising a substrate slicing step, in which the cell backside patterns are first fabricated at both sides of starting wafers before slicing, followed by cell front surface processes on the fresh side of the resulting wafers after the slicing.

Heterojunction with Intrinsic Thin layer (HIT) cell is another promising technology for advanced solar cells, with a demonstrated cell efficiency of >20%. The cell efficiency is also stable at an elevated temperature. In addition, an HIT cell can be operated as a bifacial device, i.e. generates electricity with solar illumination from either side. A typical HIT cell structure comprises doped and intrinsic amorphous silicon (a-Si:H) layer stacks at both sides of substrate for surface passivation and emitter formation. A film stack of p-type and intrinsic (un-doped) a-Si layers are deposited on one side, and a film stack of n-type and intrinsic a-Si layers are deposited on the other side of the substrate. Both sides of HIT cells are capped by a transparent conductive oxide (TCO) layer (e.g. indium tin oxide, a.k.a. 'ITO'), prior to fabrication of metal bus lines.

Amorphous silicon (a-Si) deposition in HIT cell requires a precise control of film thickness, dopant concentration and depth profile. Similar to SiNx:H and SiO$_2$ deposition, a-Si can be deposited in both inline tools (single side deposition) and furnaces (double-sided deposition enabled). In an embodiment of the invention, a substrate slicing process is carried out after an a-Si deposition step in solar cell fabrication. It is conceivable to have a double-sided a-Si film stack deposition on the starting wafer prior to the substrate slicing, and to process the fresh surface of the resulting wafers after the slicing to complete the HIT cell fabrication. From a starting wafer thickness of ~200 microns, HIT cells of <100 micron thickness can be fabricated after the slicing, with a minimal impact to cell efficiency.

The discussions above describe incorporation of a substrate slicing step in production of solar cells with different cell structures and different manufacturing flows. However, the embodiments of the present invention are not limited to solar cell manufacturing flows described above. Furthermore, the proposed method of device fabrication comprising a substrate slicing step is not limited to solar cells. Some embodiments of the present invention described above, and several other embodiments including film deposition, epitaxial materials growth, patterning, film removal processes along with a substrate slicing step, can be applicable to manufacturing schemes in solar cell production, as well as fabrication of other double-sided devices (power semiconductor devices, MEMS, etc.).

Figure 5:
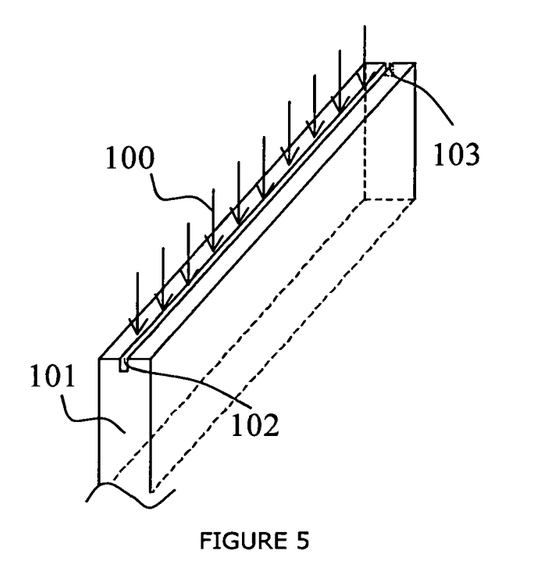
FIG. 5 illustrates a perspective view of a substrate subject to a laser irradiation at side wall for substrate slicing according to the present invention.

Some final embodiments of the present invention include methods for the substrate slicing process. A viable process for the intended applications requires slicing of a starting wafer as thin as 100-200 microns with a minimal kerf loss. A few methods are proposed in the present invention. In one embodiment, the substrate slicing is accomplished by a laser irradiation on the substrate sidewall. As illustrated in FIG. 5, a very narrow groove can be cut on the sidewall of a substrate 101 by a focused laser beam 100. A substrate slicing can be achieved with a continuous cut through the substrate 101 in a general plane parallel to substrate front/back surfaces. It can be advantageous to have a laser beam 100 with a very narrow line profile, with a width of a few microns. Such narrow laser beam 100 can be produced with a short wavelength laser coupled with advanced laser optics. Applicable lasers can include but not limited to DPSS lasers and excimer lasers of ultraviolet wavelength. For example, a 351 nm XeF excimer laser beam of 5 microns in width and >900 millimeters in length has been in use for thin film silicon melt/recrystallization process in flat panel display (FPD) fabrication. The length of the laser beam 100 can exceed the width of the substrate from Points 102 to 103. The laser beam can be also shaped in some other profiles, such as a short line, an elliptical spot or a circular spot. In addition, the laser beam can focus on a single spot, or several spots in an alignment to form a "broken" line, etc. In these scenarios, a laser irradiation across the entire width of the substrate can be achieved by scanning the laser beam or moving the substrate, in a general direction parallel to substrate front/back surfaces.

The proposed substrate slicing by laser irradiation may require an instant substrate separation during the slicing process, for the focused laser beam to access the location of slicing. In one embodiment of the present invention, an electrostatic charge is applied to the substrate, and two resulting substrates after the slicing can be separated by the electrostatic repulsion force.

Figure 6:
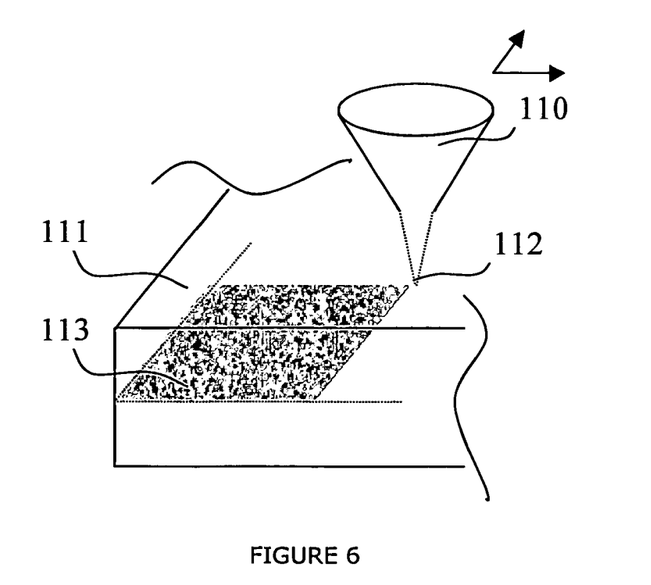
FIG. 6 illustrates a perspective view of a substrate subject to a laser irradiation with a converging point located within the substrate and the laser scanning across the substrate to form a plane of modified region for subsequent substrate slicing according to the present invention.

In the embodiments of the present invention, the proposed substrate slicing can also be carried out in a mechanical cleaving of the substrate from the side wall. In addition, the proposed substrate slicing step can be carried out in two steps, with a laser irradiation process followed by a substrate slicing step. In the laser irradiation process as illustrated in FIG. 6, a laser beam 110 converges inside the substrate at a pre-determined depth under the substrate surface 111. Under proper conditions, a modified region can be formed inside the substrate at the laser focal point 112. Scanning the laser focal point across the substrate at an approximately constant depth can form an embedded plane of modified region 113 in a general alignment parallel to the substrate surface 111. Such plane of modified region can have a mechanical strength significantly weaker than that of the single crystal materials. In a subsequent substrate slicing step, the substrate can be separated into two pieces at the plane of modified region. With the plane of the modified region at a depth of approximately half substrate thickness, two resulting substrates after the slicing are approximately equal in thickness.

In order to form a modified region inside the substrate by laser irradiation, the laser must be carefully selected to have not only a high transmittance through the substrate materials at the basic frequency, but also a good resonance with the materials electronic structure at the doubled frequency (half wavelength). For silicon substrate, the preferred laser wavelength can be in the infrared (IR) range, exceeding 1 micron in wavelength. Frequency doubling is a non-linear photonic phenomenon, and is prominent under a high irradiation fluence/power, e.g. at the focal point of a high power, short pulsed laser beam. In order to maximize the laser irradiation at the focal point, it can be advantageous to have a spot beam instead of a line beam.

With decoupled laser irradiation and substrate slicing processes, a few process steps can be sandwiched in between in the overall manufacturing flow. For example, the laser irradiation step can be first completed on bare substrates with an optimal surface roughness/structure for laser convergence, yet the substrate slicing step can be deferred until after completion of several double-sided processes.

Figure 7:
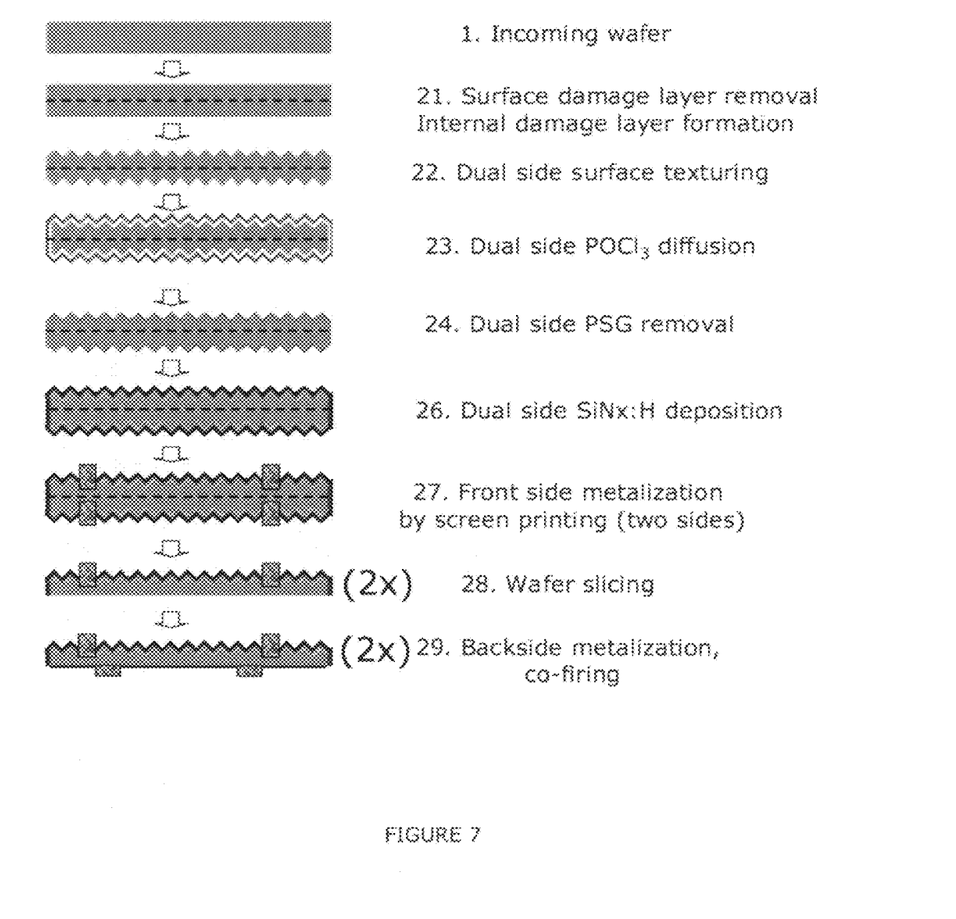
FIG. 7 illustrates a process flow for manufacturing a crystalline silicon solar cell according to another embodiment of the present invention.

FIG. 7 illustrates a solar cell production flow with such decoupled laser irradiation and substrate slicing processes. The process flow in FIG. 7 is provided to assist in describing the teachings and should not be interpreted as a limitation of the methods. An embedded plane of the modified region is first formed inside bare silicon substrates (Step 21). The substrates then undergo the process steps similar to those shown in FIG. 4, including surface texturing 22, phosphorus diffusion 23, PSG removal 24, SiHx:H deposition 26 and double-pass/double-side front-side metalization 27, prior to substrate slicing 28 and backside metalization 29.

Figure 8:
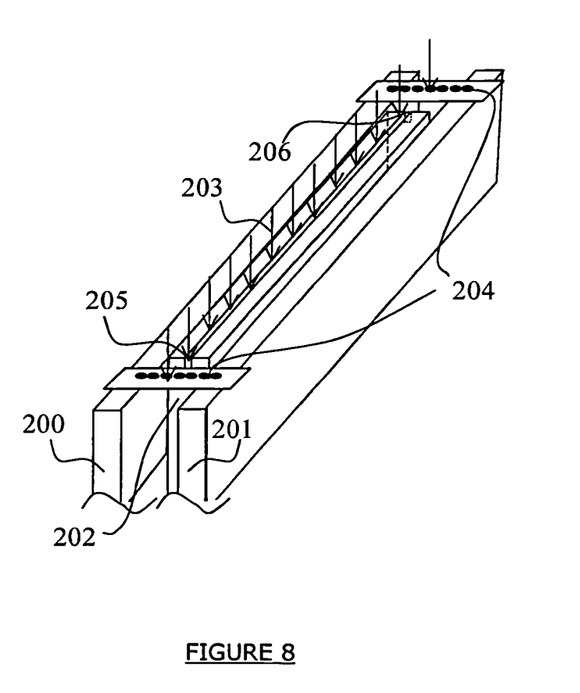
FIG. 8 illustrates a perspective view of a substrate slicing apparatus with a substrate passing through a gap between two substrate chucks and exposed to a laser irradiation at side wall of the substrate, with sensors for laser irradiation in the apparatus according to the present invention.

FIG. 8 illustrates a perspective view of a substrate slicing apparatus with a substrate 203 passing through a gap between two substrate chucks and exposed to a laser irradiation at side wall of the substrate. A laser line beam can focus on the center line of the substrate side wall for substrate slicing. In an embodiment of the invention, the apparatus can include sensor(s) 204 for laser irradiation. The laser irradiation sensor(s) 204 can be positioned across the gap between the two substrate chucks 200 and 201, at both ends of the substrate pass.

The sensors 204 can monitor laser beam profile and stability. It can be advantageous to attach the laser irradiation sensor(s) 204 directly on the chuck assembly, and the signals from the sensor(s) 204 can be used to align the laser beam 203 with the two substrate chucks. As described above, when substrates pass through the apparatus, the centerline of the substrate side wall can be fixed between the two substrate chucks 200 and 201. With an active alignment to the apparatus, the laser beam 203 can stay focused on the centerline of the substrate side wall.

When substrates pass through the apparatus, the laser irradiation initiates the substrate slicing process along the centerline of the substrate side wall. For square-shaped substrates, the laser beam/substrate slicing can start across the substrate side wall (from Points 205 to 206 in FIG. 8) at the same time. For round-shaped wafers, the laser irradiation/substrate slicing may start from a single point on the wafer instead.

It is conceivable to continue the substrate slicing process by feeding the substrate through the chuck assembly toward the focal point of the laser irradiation. Coupled with a laser line beam/scan, the slicing process can propagate into the substrate. During the substrate slicing process, the substrate has two resulting areas (after the slicing) and one starting area (prior to the slicing). In a continuous substrate slicing process by laser irradiation as proposed in the present invention, the laser irradiation must pass through the gap between the two resulting substrate areas to reach the location of substrate slicing. A viable substrate slicing process needs to produce a cut as narrow as a few microns. As every optical system has a finite Depth of Focus, a clearance between two resulting substrate areas after the slicing is necessary for the laser irradiation to reach the location of the substrate slicing. If the two resulting areas are straight planes, much of laser irradiation, even with the best possible collimation, may not pass through the gap in between to reach the location of substrate slicing.

Figure 9:
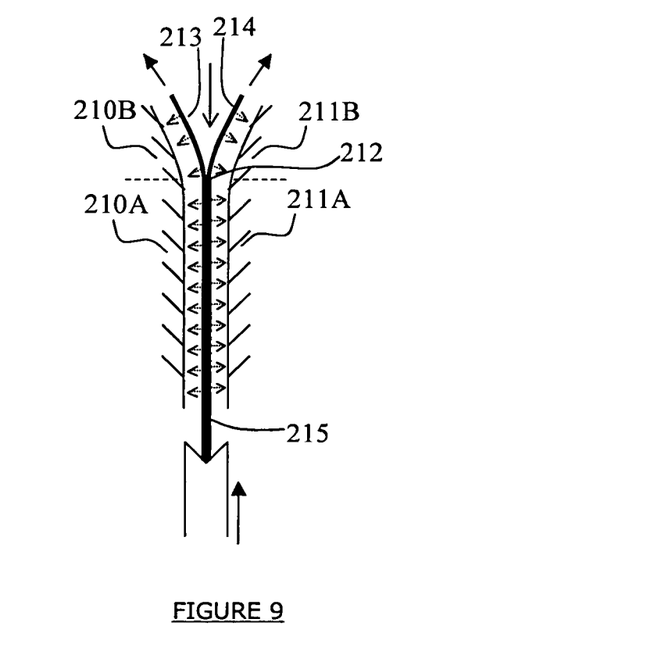
FIG. 9 illustrates a cross section in a diagrammatic view of an apparatus for substrate slicing, with a substrate passing through a gap between two substrate chucks and exposed to a laser irradiation at side wall of the substrate where one portion of the two chucks are in a general alignment parallel to each other, and another portion of the two chucks have an increasing gap in between at direction of substrate exiting the apparatus according to the present invention.

In embodiments of the present invention, the two resulting substrate areas after the slicing are spread out to obtain such required clearance for laser irradiation to the active location of substrate slicing. As illustrated in FIG. 9, the gap can increase between two opposite-facing chucks 210A/210B and 211A/211B past the location of substrate slicing 212 in the direction of substrate exiting the apparatus. From a side view, two resulting substrate areas 213/214 and the starting substrate area 215 form an approximate "Y" configuration, with the location of laser irradiation/substrate slicing 212 at the center point in the "Y".

Figure 10:
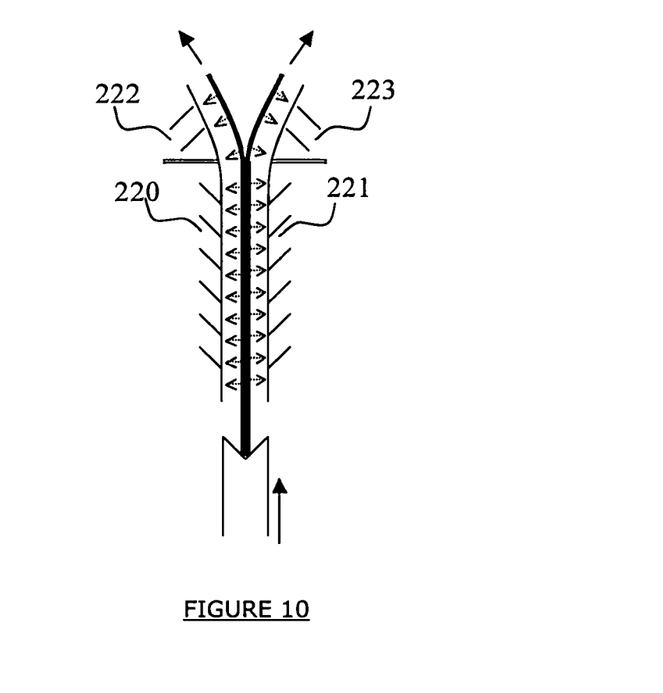
FIG. 10 illustrates a cross section in a diagrammatic view of an apparatus for laser irradiation and substrate slicing, with two pairs of substrate chucks, the first pair of the two chucks are in a general alignment parallel to each other, and the second pair of substrate chucks have an increasing gap in between at direction of substrate exiting the apparatus according to the present invention.

In the methods of the present invention, there can be at least two portions of opposite-facing substrate chucks 210A/210B and 211A/211B as illustrated in FIG. 9. The first portion of substrate chucks 210A and 211A are in a general alignment parallel to each other. As described above, side wall of a substrate passing through the gap between such portion of the substrate chucks can be aligned to a laser irradiation for substrate slicing. The gap between the second portion of two substrate chucks 210B and 211B gradually increases to pull apart the two resulting substrate areas after the slicing. In one approach, the first portion and second portion of each substrate chuck can be designed as one integrated unit with a continuous surface, as shown in FIG. 9 (210A and 210B, 211A and 211B). In another approach, the first portion and second portion of each substrate chuck can be designed as two units adjacent to each other as shown in FIGS. 10 (220 and 222, 221 and 223). The second set of substrate chucks 222 and 223 can be operated independently from the first pair of substrate chucks 220 and 221. The two approaches share the same concept of spreading out the two resulting areas of the substrate after slicing, yet can have some differences in design details and operation modes.

The present invention takes advantage of the flexible nature of thin semiconductor substrates in the intended applications of the substrate slicing process. For instance, nominal substrate thickness has dropped to <200 microns in crystalline silicon solar cell production, thus the resulting wafer after a substrate slicing step can be <100 microns in thickness. A silicon substrate of such thickness is flexible. As a result, a curved surface design can be adopted for the second portion of the substrate chucks 210B and 211B as shown in FIG. 9, or for the second pair of the substrate chucks 222 and 223 as shown in FIG. 10. The design can yield a clearance for the laser irradiation onto the location for substrate slicing. The design of chuck surface curvature needs to take into account factors such as substrate thickness, substrate mechanical property, substrate quality and integrity of film stacks on the substrates. A thinner semiconductor substrate is in general more flexible, and can require less chucking force to be compliant to a curved chuck surface. On the other hand, a thinner semiconductor substrates can be more fragile and must be handled with additional care.

In the discussions above, the two resulting substrate areas after the slicing are separated by chucking forces of the substrate chucks. The substrate separation can also be achieved by some other methods. In one embodiment of the present invention, an electrostatic charge can be applied to the substrate, and two resulting substrate areas after the slicing can be separated by the electrostatic repulsion force.

A laser irradiation requires a pass to the substrate free of absorption in the laser wavelength. In addition, an irradiation of high power laser beam on semiconductor materials requires an ambient free of oxidant and contamination for substrate surfaces. It is conceivable to have the laser irradiation apparatus operated in an inert ambient. In addition, many non-contact chucks comprise a fluid-mechanical design with a purge gas as the fluid. If non-contact chucks are adopted in the apparatus as illustrated in FIGS. 9 and 10, a purge gas without absorption at the wavelength of laser irradiation can be selected for the chuck operation.

Figure 11:
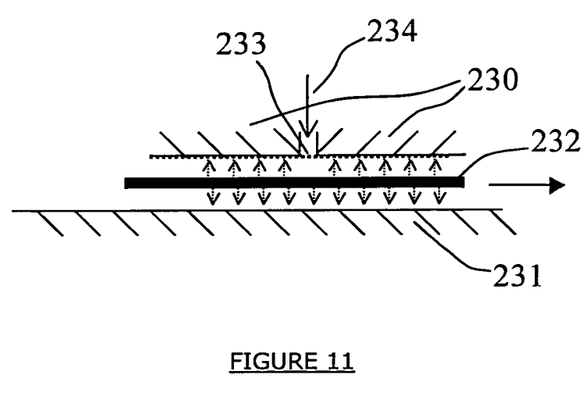
FIG. 11 illustrates a cross section in a diagrammatic view of an apparatus for laser irradiation, with a substrate passing through a gap between two substrate chucks, and with a laser irradiation through an aperture in one chuck onto the substrate, according to the present invention.

The sections above discussed apparatus for a direct laser irradiation on the wafer side wall for substrate slicing. As discussed earlier, another approach for substrate slicing comprises of a laser scan across the substrate surface to form a plane of modified region inside the substrate, and in a subsequent step the substrate can be cleaved along the plane of modified region. In order to cleave the substrate from the sidewall into two pieces of approximately half thickness, the laser irradiation apparatus must accommodate the substrate thickness variation to maintain a laser convergence point in the middle between substrate front and back surfaces. As illustrated in FIG. 11, an apparatus for laser irradiation can comprise two parallel and opposite-facing substrate chucks 230 and 231, with substrate 232 passing through the gap in between. As the two substrate chucks 230 and 231 function as tandem springs, the middle of substrate 232 thickness is aligned with the center of the gap between the two substrate chucks. In one approach, one of the substrate chucks can comprise an aperture 233 for laser irradiation onto the substrate. In another approach, the apparatus can include a window instead of an aperture for laser irradiation. In yet another approach, the chucks can be made of materials transparent to the laser wavelength and the laser beam can pass directly through the chuck and illuminate onto the substrate.

Some single crystal materials such as silicon can be mechanically cleaved, preferably along certain crystal orientations. As discussed above, a thin substrate can be separated into two pieces of approximately half of the thickness by a combination of laser irradiation and mechanical cleaving steps. In one approach, a laser irradiation and materials ablation can prepare a groove on the substrate side wall. In another approach, a laser irradiation can generate a plane of modified region between substrate front and back surfaces. In both approaches, it is conceivable to split the substrate from side wall in a subsequent mechanical cleaving step.

Figure 12:
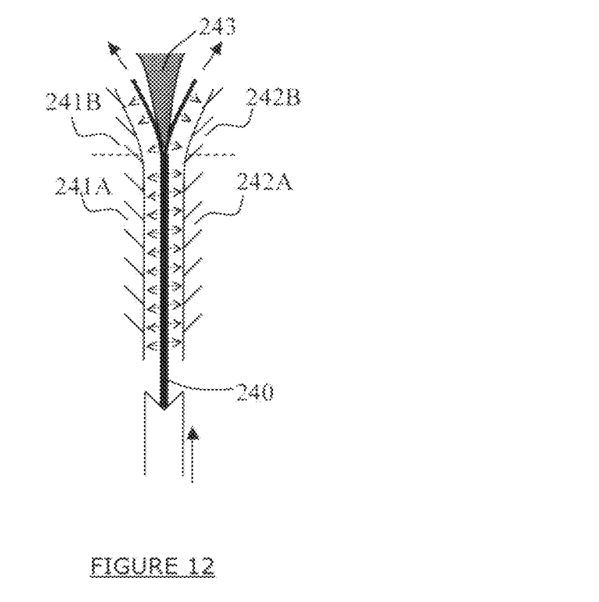
FIG. 12 illustrates a cross section in a diagrammatic view of an apparatus for substrate slicing, with a substrate passing through a gap between two substrate chucks, and the substrate is separated from middle of the side wall with assistance of a mechanical cleaver according to the present invention.

In order to separate a thin substrate along a plane in a general direction parallel to substrate front/back surfaces, the substrate needs to be held with uniform and balanced forces from both sides. In the proposed method of the present invention, the apparatus can again comprise an assembly of two opposite-facing substrate chucks, as illustrated in FIG. 12. The first portion of non-contact substrate chucks 241A and 242A are in a general alignment parallel to each other to center the substrate 240 passing through the unit. The gap between the two substrate chucks increases in the second portion 241B and 242B along the wafer exiting direction. A curved surface design can be adopted for the second portion of the two substrate chucks 241B and 242B to handle fragile thin substrate materials. The first portion and second portion of each chuck (241A and 241B, 242A and 242B) can be one integrated unit, or designed/manufactured as two units adjacent to each other. With a mechanical cleaver 243 positioned at the transition point between the first and second portions of the substrate chucks (241A to 241B, 242A to 242B), the substrate can be split from its side wall. The mechanical cleaver can be a wedge, a cutting wire or of some other shapes.

As discussed above, a substrate slicing process can be carried out with decoupled laser irradiation and mechanical cleaving steps. With decoupled laser irradiation and substrate slicing processes, a few process steps can be sandwiched in between in the overall manufacturing flow. It can be advantageous in fabrication of double-sided devices. For instance, a laser irradiation step can be first completed on bare substrates to form the plane of modified region inside the substrate, yet the substrate slicing step can be deferred until after completion of several double-sided processes in double-sided device fabrication.

Figure 13:
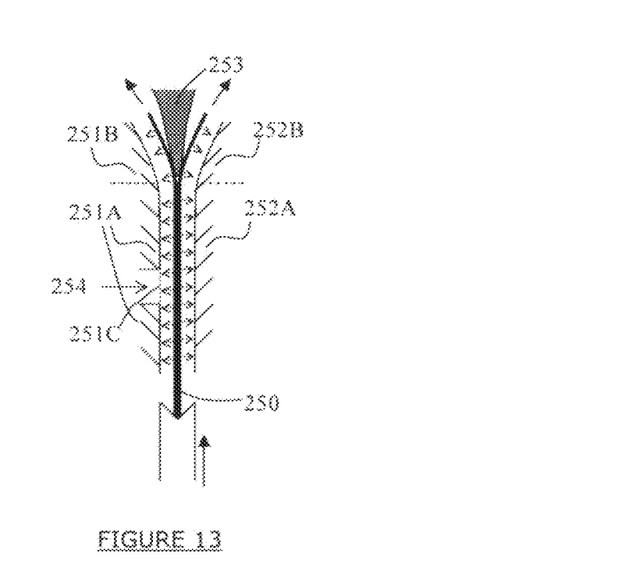
FIG. 13 illustrates a cross section in a diagrammatic view of an apparatus for substrate slicing, with a substrate passing through a gap between two substrate chucks, with a laser irradiation through an aperture in one chuck onto the substrate, and the substrate is separated from middle of the side wall with assistance of a mechanical cleaver according to the present invention.

On the other hand, if back-to-back laser irradiation (on substrate surface) and mechanical cleaving steps for substrate slicing can be accommodated in the device process flow, it can be desirable to combine the two processes in a single manufacturing tool. Compared with two separate manufacturing equipments, an integrated laser irradiation and mechanical cleaving tool can yield a lower production cost and a shorter work-in-process (WIP) time. FIG. 13 illustrates a possible setup for such a laser irradiation/mechanical cleaving tool. A substrate 250 passes through the opening between two opposite-facing substrate chucks 251A/251B and 252A/252B. A portion of two substrate chucks 251A and 252A are in a general alignment parallel to each other, with the substrate centered in between. A laser irradiation 254 illuminates on the substrate surface through a window 251C on one of the substrate chucks, e.g. to form a plane of modified region inside the substrate. A mechanical cleaver is positioned at end of the parallel portion of the substrate chucks 251A and 252A to split the substrate along the plane of modified region, and the gap increases between the second portion of the two substrate chucks 251B and 252B to spread out the resulting substrates after the slicing.

What is claimed is:

1. A method of fabricating an electronic device, comprising:
processing a front side and a back side of a first wafer, wherein the front side is substantially parallel to the back side;
slicing the first wafer into a second wafer and a third wafer by moving the first wafer through a gap between two substrate chucks, wherein the first wafer is separated into the second wafer and the third wafer in the gap in a first region between the two substrate chucks and the second wafer and the third wafer are further separated apart in a gap in a second region between the two substrate chucks, wherein the gap in the second region is wider than the gap in the first region, and wherein one side of the second wafer is the front side of the first wafer that existed prior to the first wafer being sliced and one side of the third wafer is the back side of the first wafer that existed prior to the first wafer being sliced; and
processing the other sides of the second and third wafers.

2. A method according to claim 1, wherein said processing of the front side and the back side of the first wafer comprises surface texturing.

3. A method according to claim 1, wherein said processing of the front side and the back side of the first wafer comprises ion diffusion.

4. A method according to claim 1, wherein said processing of the other sides of the second and third wafers comprises ion diffusion.

5. A method according to claim 1, wherein said processing of the front side and the back side of the first wafer comprises film deposition.

6. A method according to claim 1, wherein said processing of the other sides of the second and third wafers comprises film deposition.

7. A method according to claim 1, wherein said processing of the front side and the back side of the first wafer comprises patterning.

8. A method according to claim 1, wherein said processing of the other sides of the second and third wafers comprises patterning.

9. A method according to claim 1, wherein said processing of the front side and the back side of the first wafer comprises film removal.

10. A method according to claim 1, wherein said processing of the other sides of the second and third wafers comprises film removal.

11. A method of fabricating an electronic device, comprising:
processing a front side and a back side of a first wafer, wherein the front side is substantially parallel to the back side, and wherein processing the front side and the back side the first wafer comprises depositing an insulating materials layer on the front side and the back side, patterning the front side and the back side, and metalizing the front side and the back side;
slicing the first wafer into a second wafer and a third wafer by moving the first wafer through a gap between two substrate chucks, wherein the first wafer is separated into the second wafer and the third wafer in the gap in a first region between the two substrate chucks and the second wafer and the third wafer are further separated apart in a gap in a second region between the two substrate chucks, wherein the gap in the second region is wider than the gap in the first region, and wherein one side of the second wafer is the front side of the first wafer that existed prior to the first wafer being sliced and one side of the third wafer is the back side of the first wafer that existed prior to the first wafer being sliced; and processing the other sides of the second and third wafers.

12. A method of fabricating an electronic device, comprising:
- processing a front side and a back side of a first wafer, wherein the front side is substantially parallel to the back side, and wherein processing the front side and the back side of the first wafer comprises surface texturing the front side and the back side, diffusing phosphorous on the front side and the back side, removing phosphosilicate glass (PSG) from the front side and the back side, depositing silicon nitride ($SiN_x$:H) on the front side and the back side, and metalizing the front side and the back side;
- slicing the first wafer into a second wafer and a third wafer by moving the first wafer through a gap between two substrate chucks, wherein the first wafer is separated into the second wafer and the third wafer in the gap in a first region between the two substrate chucks and the second wafer and the third wafer are further separated apart in a gap in a second region between the two substrate chucks, wherein the gap in the second region is wider than the gap in the first region, and wherein one side of the second wafer is the front side of the first wafer that existed prior to the first wafer being sliced and one side of the third wafer is the back side of the first wafer that existed prior to the first wafer being sliced; and
- processing the other sides of the second and third wafers.

13. A method of fabricating an electronic device, comprising:
- processing a front side and a back side of a first wafer, wherein the front side is substantially parallel to the back side, and wherein processing the front side and the back side of the first wafer comprises surface texturing the front side and the back side, diffusing boron on the front side and the back side, depositing $SiN_x$:H on the front side and the back side, and metalizing the front side and the back side;
- slicing the first wafer into a second wafer and a third wafer by moving the first wafer through a gap between two substrate chucks, wherein the first wafer is separated into the second wafer and the third wafer in the gap in a first region between the two substrate chucks and the second wafer and the third wafer are further separated apart in a gap in a second region between the two substrate chucks, wherein the gap in the second region is wider than the gap in the first region, and wherein one side of the second wafer is the front side of the first wafer that existed prior to the first wafer being sliced and one side of the third wafer is the back side of the first wafer that existed prior to the first wafer being sliced; and
- processing the other sides of the second and third wafers.

14. The method according to claim 1, wherein said slicing the first wafer into the second and third wafers comprises irradiating a laser beam on a sidewall of the first wafer, wherein the sidewall is substantially perpendicular to the front side and the back side of the first wafer.

15. The method according to claim 1, wherein said slicing the first wafer into second and third wafers comprises mechanically cleaving a sidewall of the first wafer, wherein the sidewall is substantially perpendicular to the front side and the back side of the first wafer.

16. The method according to claim 14, comprising a mechanical cleaving of the sidewall of the first wafer before slicing the first wafer into the second and third wafers.

17. The method according to claim 15, comprising laser irradiating the first wafer before slicing the first wafer into the second and third wafers.

18. The method according to claim 1, wherein said slicing the first wafer into the second and third wafers comprises applying an electrostatic charge on the first wafer.

\* \* \* \* \*